(12) United States Patent
Kim et al.

(10) Patent No.: US 7,252,716 B2
(45) Date of Patent: Aug. 7, 2007

(54) GAS INJECTION APPARATUS FOR SEMICONDUCTOR PROCESSING SYSTEM

(75) Inventors: Tae-wan Kim, Yongin (KR); Yuri Nikolaevich Tolmachev, Suwon (KR); Dong-joon Ma, Anyang (KR); Sergiy Yakovlevich Navala, Suwon (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 263 days.

(21) Appl. No.: 10/713,258

(22) Filed: Nov. 17, 2003

(65) Prior Publication Data

US 2004/0099378 A1    May 27, 2004

(30) Foreign Application Priority Data

Nov. 15, 2002    (KR) ...................... 10-2002-0071047

(51) Int. Cl.
    C23C 16/00        (2006.01)
    H01L 21/306       (2006.01)
    C23F 1/00         (2006.01)
(52) U.S. Cl. .................................. 118/715; 156/345.29
(58) Field of Classification Search ................ 118/715, 118/728, 50; 156/345.29, 345.33
    See application file for complete search history.

(56) References Cited

U.S. PATENT DOCUMENTS 5,522,931 A     6/1996  Iwashita et al.
6,001,267 A *  12/1999  Os et al. ........................ 216/67
6,402,849 B2 *  6/2002  Kwag et al. ................. 118/715
6,415,736 B1   7/2002  Hao et al.
6,432,831 B2   8/2002  Dhindsa et al.

FOREIGN PATENT DOCUMENTS

WO    WO 143857 A1 *   6/2001

OTHER PUBLICATIONS

USPTO Translation of WO 01/43857 A1.*

* cited by examiner

Primary Examiner—Rudy Zervigon
(74) Attorney, Agent, or Firm—Lee & Morse, P.C.

(57) ABSTRACT

A gas injection apparatus for injecting a reactive gas into a reaction chamber of a semiconductor processing system includes an injector in contact with an inner surface of a wall of the reaction chamber. The injector has a plurality of nozzles through which the reactive gas is injected into the reaction chamber. A gas inlet penetrates the wall of the reaction chamber. A manifold is disposed between the wall of the reaction chamber and the injector, and supplies the reactive gas flowing through the gas inlet to the nozzles. Gas channels in the manifold are arranged on a plurality of levels to equalize the lengths of gas paths connecting the gas inlet to each of the plurality of nozzles. This configuration makes the flow rate of reactive gas supplied through each of the plurality of nozzles to the reaction chamber uniform.

20 Claims, 9 Drawing Sheets

121 122 123 124
120

GAS INJECTION APPARATUS FOR SEMICONDUCTOR PROCESSING SYSTEM

BACKGROUND OF THE INVENTION

1. Field of the Invention

The present invention relates to a semiconductor processing system, and more particularly, to a gas injection apparatus for supplying a reactive gas for processing a semiconductor substrate into a reaction chamber.

2. Description of the Related Art

Semiconductor processing systems such as plasma processing systems or magnetron sputtering systems have been mostly used in a micromachining process performed on a semiconductor substrate for manufacturing a semiconductor device or flat display panel. For example, plasma enhanced chemical vapor deposition (PECVD) systems or high-density plasma CVD (HDP-CVD) systems have been mostly used to deposit a material layer on a substrate by CVD. Magnetron sputtering systems have been widely used to deposit a material layer on a substrate by physical vapor deposition (PVD).

Semiconductor processing systems are being developed that best suit various process characteristics for semiconductor processing. In particular, as substrate diameter increases, recent developments in semiconductor processing systems have focused on coping with large-sized substrates to achieve improved yield. That is, as wafer sizes change from 200 mm to 300 mm, improvement in uniformity over a large wafer is of particular concern to wafer processing. To achieve the desired uniformity, an important factor is the uniform distribution of reactive gas across a reaction chamber when supplying it to the reaction chamber through a gas injection apparatus for a semiconductor processing system.

Accordingly, to achieve the uniformity in gas distribution through a gas injection apparatus, many different types of gas injection apparatuses have been developed. One such gas injection apparatus has a plurality of nozzles positioned at a plurality of levels in a direction perpendicular to a substrate. A gas distribution nozzle positioned at a higher level extends further towards the center of a reaction chamber than nozzles at a lower level. This gas injection apparatus may be effective in achieving the gas distribution uniformity, but is likely to prohibit ion flux flowing to the substrate due to the portions of nozzles extending toward the interior of the reaction chamber.

Another type of gas injection apparatus is a showerhead type gas injection apparatus. Here, gas is supplied to a showerhead through baffles and holes in order to provide a uniform gas pressure distribution across the backside of the showerhead. Another example of a showerhead type gas injection apparatus varies the sizes of holes in a baffle plate to achieve an even gas pressure distribution at the backside of a showerhead. However, it is very difficult to optimize these systems for a wide range of gas pressures and flow rates. Another drawback is that the showerhead type gas injection apparatus is suitable only for a parallel plate plasma reactor and cannot be applicable to magnetron sputtering systems. Furthermore, when used in an Electron Cyclotron Resonance (ECR) plasma reactor, the showerhead disposed at an upper portion of the reaction chamber prohibits microwave propagation.

Instead, a ring-shaped gas injection apparatus, an example of which is shown in FIG. 1, is used for ECR plasma reactors and other actual applications. The ring-shaped gas injection apparatus 10 shown in FIG. 1 has a gas channel 14 formed therein so that reactive gas can pass through the gas channel 14, a gas inlet 12 connected to the gas channel 14 at the outer circumference of the apparatus 10, and a plurality of nozzles 16 at the inner circumference of the apparatus 10. The nozzles 16 are evenly spaced along the inner circumference of the gas injection apparatus 10.

The gas injection apparatus 10 is configured to form a gas path connecting the gas inlet 12 to each of the plurality of nozzles 16 through the gas channel 14. The length of the gas path between the gas inlet 12 and each nozzle 16 varies. The difference in gas paths creates a difference in pressure of reactive gas at each nozzle due to a pressure drop after collision of reactive gas with a wall of the gas channel 14. This makes the gas flow rate through each nozzle 16 uneven.

FIG. 2 is a graph showing gas pressure and flow rate at each nozzle in the gas injection apparatus of FIG. 1. In the graph, the gas inlet 12 is labeled as number "0", and the nozzles are labeled as the numbers "1" to "16" in the order that they are disposed along the inner circumference of the gas injection apparatus.

The graph in FIG. 2 shows the result of calculating gas pressure and flow rate when supplying $O_2$ gas at a flow rate of 100 standard cubic centimeters per minute (sccm) under a pressure of 10 mTorr in the reaction chamber. The gas channel has a rectangular cross-section of 1×4 mm, and each nozzle has a diameter of 0.5 mm and a length of 2 mm. The gas channel is formed into a ring shape having a diameter of 241 mm.

As is evident from the graph in FIG. 2, gas pressure decreases in a direction away from the gas inlet, i.e., as the length of the gas path increases. The gas flow rate at the nozzle located closest to the gas inlet is approximately four times that at the nozzle located farthest from it. In this manner, a conventional ring-shaped gas injection apparatus makes gas pressure and flow rate at each nozzle extremely nonuniform due to differences in the lengths of gas paths connecting a gas inlet to each nozzle through a gas channel.

The design and configuration of a gas injection apparatus significantly affects the uniformity over a substrate being processed. As the size of the gas injection apparatus increases and the sectional area of the gas channel decreases, nonuniformity in gas distribution becomes larger. In order not to prohibit ion flux and microwave propagation, it is desirable to make the gas injection apparatus as thin as possible. Despite this structural requirement for a gas channel having a small sectional area, a large gas injection apparatus with a thin gas channel still has a problem with uniform pressure distribution.

Accordingly, as wafer sizes continue to increase, ensuring even gas distribution to the reaction chamber with a conventional gas injection apparatus becomes more difficult. This deteriorates uniformity across a semiconductor substrate being processed, which in turn significantly worsens the quality and yield of semiconductor devices.

SUMMARY OF THE INVENTION

It is a feature of an embodiment of the present invention to provide a gas injection apparatus for a semiconductor processing system having a manifold disposed to make the length of a gas channel connecting a gas inlet to each of a plurality of nozzles equal for uniform distribution of reactive gas to a reaction chamber.

It is another feature of an embodiment of the present invention to provide a gas injection apparatus that can be adopted for various kinds of semiconductor processing systems such as PECVD, HDP-CVD, and magnetron sputtering systems.

It is yet another feature of an embodiment of the present invention to provide a gas injection apparatus that can be adopted for a semiconductor processing system having a large reaction chamber to achieve uniform distribution of a reactive gas irrespective of the size of a reaction chamber, gas pressure, and flow rate.

At least one of the above and other features may be realized by providing a gas injection apparatus for injecting a reactive gas into a reaction chamber of a semiconductor processing system. The gas injection apparatus includes an injector disposed to contact an inner surface of a wall of the reaction chamber. The injector has a plurality of nozzles penetrating it, through which the reactive gas is injected into the reaction chamber. A gas inlet penetrates through the wall of the reaction chamber. A manifold is disposed between the wall of the reaction chamber and the injector, for supplying the reactive gas flowing through the gas inlet to each of the plurality of nozzles. The manifold is configured to have gas channels arranged on at least two levels that are used to equalize the lengths of gas paths connecting the gas inlet to each of the plurality of nozzles. Thus, the flow rate of gas supplied through each of the plurality of nozzles to the reaction chamber is evened out.

One level of the gas channel of the at least two levels of gas channels may be split into two branches at either end of the next higher level of the gas channel into two branches, each branch having the same length. The highest level of the gas channel may be split into two branches each having the same length at a portion connecting with the gas outlet. Each of the plurality of nozzles may be connected to either end of the lowest level of the gas channel. A support structure may be formed in the inner surface of the wall of the reaction chamber, and the injector may be inserted into the support structure. The gas channels may be formed in the shape of a groove on the surface of the injector in contact with the inner surface of the wall of the reaction chamber. Alternatively, the gas channels may be formed in the shape of a groove on the inner surface of the wall of the reaction chamber. The injector may be formed of a dielectric liner such as a ceramic material.

Exits of the plurality of nozzles may be evenly spaced on the surface of the injector opposite to the interior of the reaction chamber, along the circumference of the injector.

According to a specific first embodiment of the present invention, the injector is flat and ring-shaped and disposed to contact the bottom of an upper wall of the reaction chamber. Furthermore, the gas channels may be disposed at different positions within the reaction chamber.

According to a specific second embodiment of the present invention, the injector is cylindrical and disposed to contact an inner surface of a sidewall of the reaction chamber.

According to a specific third embodiment of the present invention, the injector is conical and disposed to contact a sloped inner surface of an upper wall of the reaction chamber.

In the specific second and third embodiments, the gas channels may be disposed in the direction of the height of the injector so that a high-level gas channel relative to the gas inlet is lower in the reaction chamber than a low-level gas channel relative to the gas inlet.

The gas injection apparatus may further include a showerhead type injector disposed at the top of the reaction chamber for supplying the reactive gas towards the center of the reaction chamber.

Through the above configurations, the present invention may achieve at least one of the following: high level uniformity in gas flow rates by and adaptation to various kinds of semiconductor processing systems including plasma processing systems and magnetron sputtering systems irrespective of the size of the reaction chamber, gas pressure and flow rate.

BRIEF DESCRIPTION OF THE DRAWINGS

The above and other features of the present invention will become more apparent to those of ordinary skill in the art by describing in detail embodiments thereof with reference to the attached drawings in which.

DETAILED DESCRIPTION OF THE INVENTION

Figure 1:
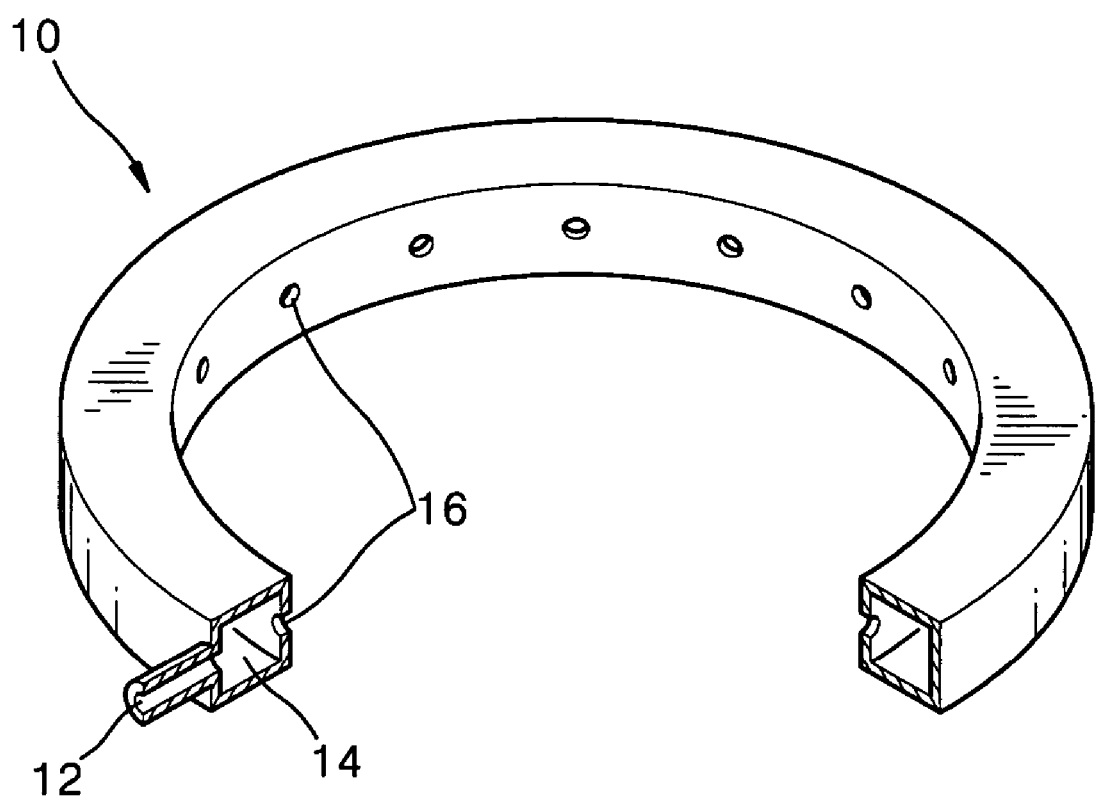
FIG. 1 is an incised perspective view of a conventional ring-shaped gas injection apparatus used in a semiconductor processing system.

Korean Patent Application No. 2002-71047, filed on Nov. 15, 2002, in the Korean Intellectual Property Office, and entitled: "GAS INJECTION APPARATUS FOR SEMICONDUCTOR PROCESSING SYSTEM," is incorporated herein by reference in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Figure 3A:
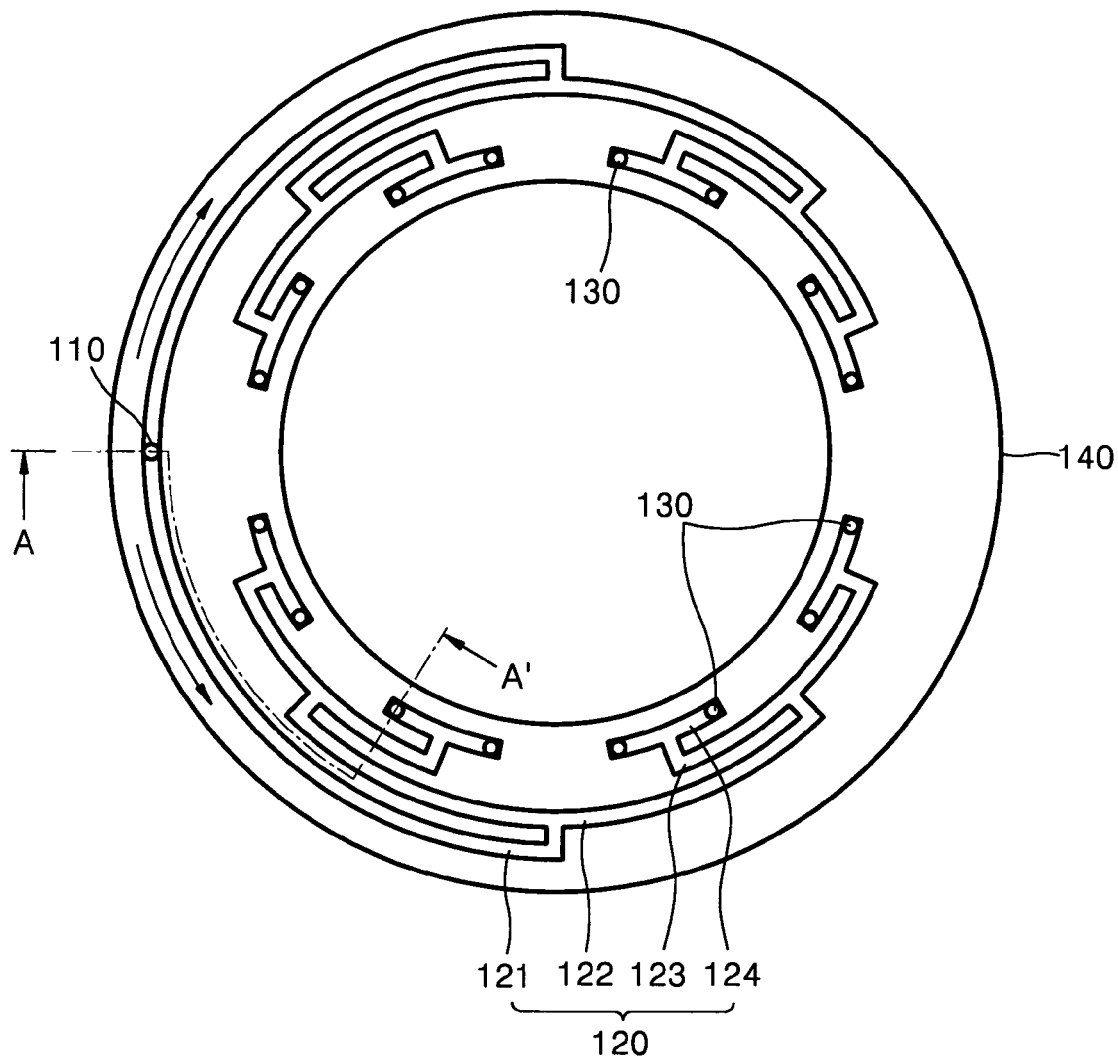
FIG. 3A illustrates a basic configuration of a gas injection apparatus for a semiconductor processing system according to the present invention.
Figure 3B:
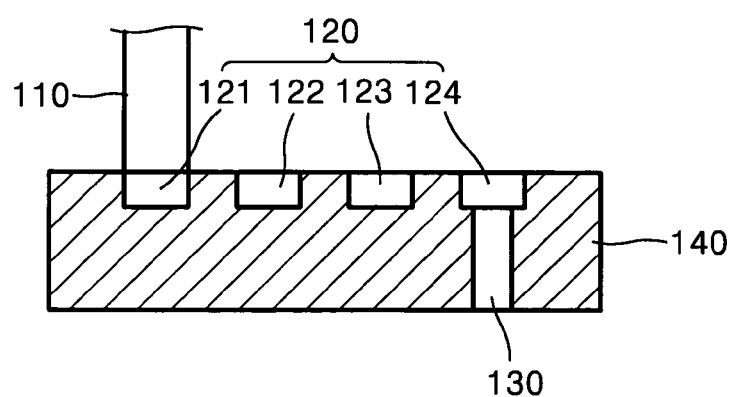
FIG. 3B is an enlarged cross-sectional diagram of the gas injection apparatus of FIG. 3A, taken along line A-A'.

Referring to FIGS. 3A and 3B, a gas injection apparatus according to the present invention includes a gas inlet 110 through which a reactive gas flows from the outside, a plurality of nozzles 130 through which the reactive gas is injected into a reaction chamber, and a manifold 120 through which the reactive gas is supplied from the gas inlet 110 to each of the plurality of nozzles 130. The manifold 120 is configured to equalize the lengths of gas channels connecting the gas inlet 110 to each of the plurality of nozzles 130. For this purpose, the manifold 120 includes gas channels 121-124 arranged on a plurality of levels.

The gas inlet 110 is formed to penetrate through a wall of the reaction chamber, and the plurality of nozzles 130 are formed in a ring-shaped injector 140 installed to contact the inner surface of the wall of the reaction chamber. The gas channels 121-124 of the manifold 120 are disposed between the injector 140 and the wall of the reaction chamber. Specifically, the gas channels 121-124 may be formed on one surface of the injector 140, i.e., the surface in contact with the inner surface of the reaction chamber wall, in the shape of a groove having a predetermined depth. As will be described later, the gas channels 121-124 may be formed on the inner surface of the reaction chamber wall in the shape of a groove having a predetermined depth.

Each of the plurality of nozzles 130 is formed to penetrate the injector 140 from both ends of each of the gas channels 124 at the lowest level toward the interior of the reaction chamber. In other words, the entrance of each nozzle 130 is connected to the gas channels 124 at the lowest level while the exit is open toward the interior of the reaction chamber. The exits of the plurality of nozzles 130 may be spaced evenly along the circumference on the other surface of the injector 140, i.e., the surface opposite to the interior of the reaction chamber.

The gas channels may be arranged on a plurality of levels, i.e., at least two, as described above. For example, the gas channels 121-124 may be arranged on four levels as shown in FIG. 3A. As shown, each level is connected at terminal ends thereof to a center of the subsequent level. First gas channels 121, disposed at a first level, which is the highest level, branch off from the gas inlet 110 into two directions, each branch extending the same length along the circumference of the injector 140. Second gas channels 122 disposed at a second level branch off from either end of the first gas channel 121 into two directions, each branch extending the same length along the circumference of the injector 140. Third gas channels 123 disposed at a third level branch off from either end of each of the second gas channels 122 into two directions, each branch extending the same length along the circumference of the injector 140. Fourth gas channels 124 disposed at a fourth level, which is the lowest level for this particular example, are formed in the same manner as above. Nozzles 130 may be disposed at ends of each of the fourth gas channels 124 as described above. If the number of levels for the gas channels 121-124 is four as described above, the maximum number of evenly spaced nozzles 130 is $2^4$, i.e., 16. Thus, if the number of levels is n, the maximum number of evenly spaced nozzles 130 is $2^n$. The gas channels 121-124 arranged in a plurality of levels equalize the lengths of the gas paths connecting the gas inlet 110 to each of the plurality of nozzles 130.

Figure 4:
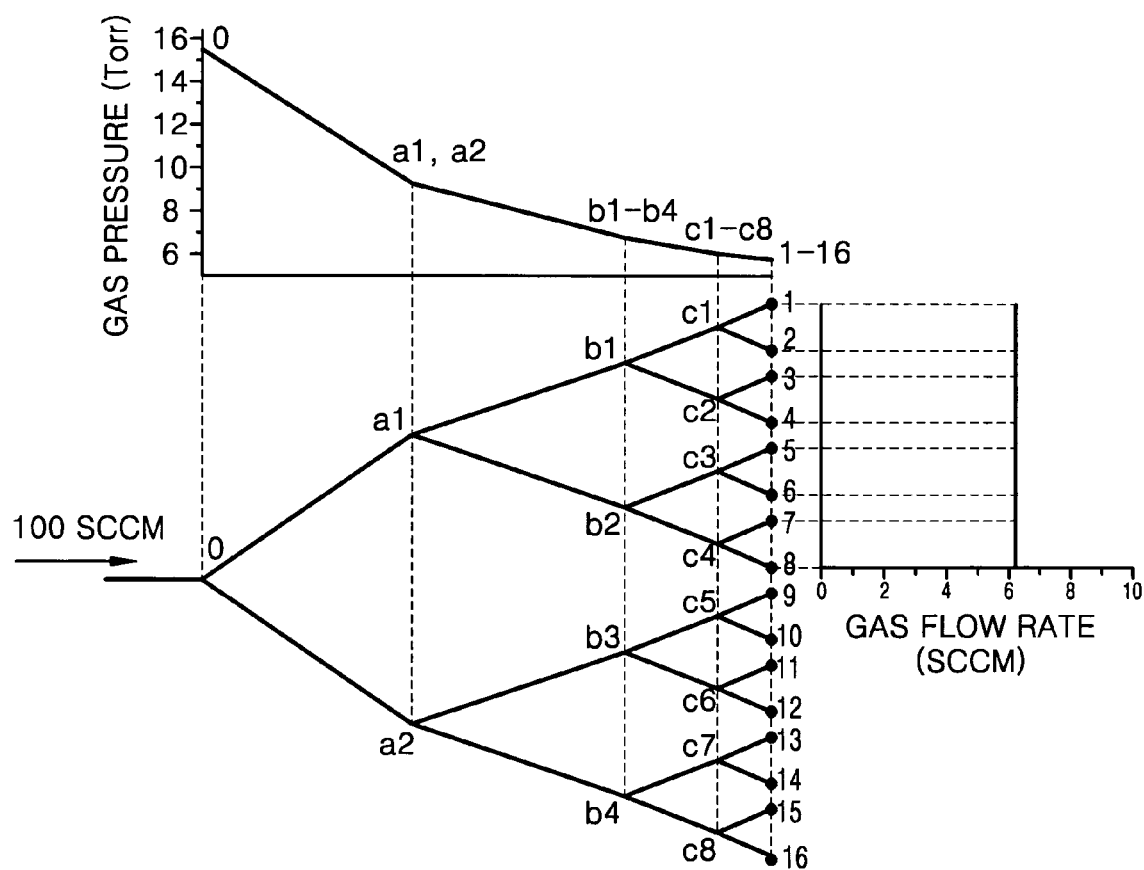
FIG. 4 is a graph showing gas pressure and flow rate at each nozzle in a gas injection apparatus according to the present invention.

FIG. 4 is a graph showing gas pressure and flow rate at each nozzle in a gas injection apparatus according to the present invention. In the graph, a gas inlet is labeled as number "0", ends of a first level of gas channels are indicated by "a1" and "a2", ends of a second level of gas channels are indicated by "b1" through "b4", and ends of a third level of gas channels are indicated by "c1" through "c8". A plurality of nozzles are labeled with the numbers "1" to "16" in the order that they are disposed on the inner side of an injector, along the circumference thereof.

Figure 2:
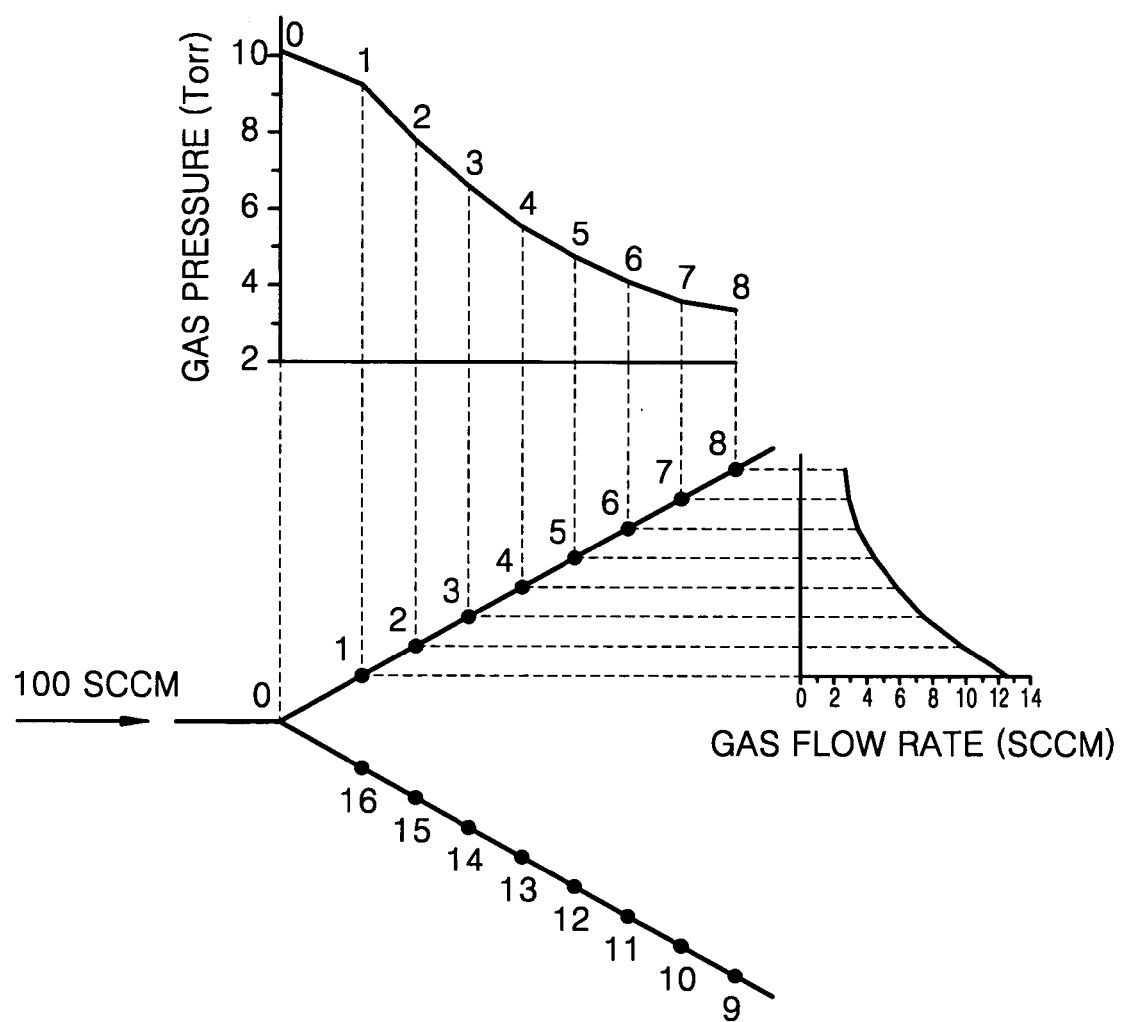
FIG. 2 is a graph illustrating gas pressure and flow rate at each nozzle in the gas injection apparatus of FIG. 1.

The graph in FIG. 4 shows the result of calculating gas pressure and flow rate under the same conditions as in FIG. 2 for comparison, where $O_2$ gas is supplied at a flow rate of 100 standard cubic centimeters per minute (sccm) at a pressure of 10 mTorr in the reaction chamber. Each of the gas channels has a rectangular cross-section of 1×4 mm and each of the nozzles has a diameter of 0.5 mm and a length of 2 mm. The diameters of first through fourth levels of gas channels are set as 282 mm, 268 mm, 255 mm, and 241 mm, respectively. Thus dimensions are merely representative.

As is evident from the graph in FIG. 4, gas pressure decreases in a direction away from the gas inlet along gas paths due to pressure drop after the collision of reactive gas with inner walls of the gas channels. However, since the lengths of gas paths connecting the gas inlet to either end of each level of the gas channels are all equal, each of the gas paths experiences an equal pressure drop. Thus, this makes gas pressure at each of the plurality of nozzles equal. Furthermore, flow rates of gas supplied into the reaction chamber through the plurality of nozzles are equal. When the flow rate of gas supplied through the gas inlet is 100 sccm as shown in FIG. 4, the flow rate of gas injected into the reaction chamber through each of the 16 nozzles is 100/16 sccm, i.e., 6.25 sccm.

The above assumptions that the flow rate of gas injected through the gas inlet is 100 sccm and the pressure in the reaction chamber is 10 mTorr are typical of high-density plasma CVD (HDP-CVD) systems. However, even if the gas flow rate and pressure in the reaction chamber vary, the gas injection apparatus according to the present invention can maintain a uniform distribution of a reactive gas supplied into the reaction chamber. Furthermore, if the diameter of each level of the gas channels varies, the distribution of reactive gas is made uniform by the above structure in which the gas channels are arranged. Thus, the gas injection apparatus according to the present invention can provide a uniform distribution of reactive gas without being restricted by the size of the reaction chamber, gas pressure, and flow rate, thus making it possible to adopt the gas injector apparatus for a semiconductor processing system having a large reaction chamber.

Since two or more gas components are mixed evenly in each of the gas channels due to a uniform pressure distribution between the gas paths leading to each of the plurality of nozzles, a mixture of two or more gases can be evenly distributed over the reaction chamber through a single gas injection apparatus.

Gas injection apparatuses according to specific embodiments of the present invention in conjunction with processing systems will now be described with references to FIGS. 5-9. The same reference numeral in different drawings represents the same element.

Figure 5:
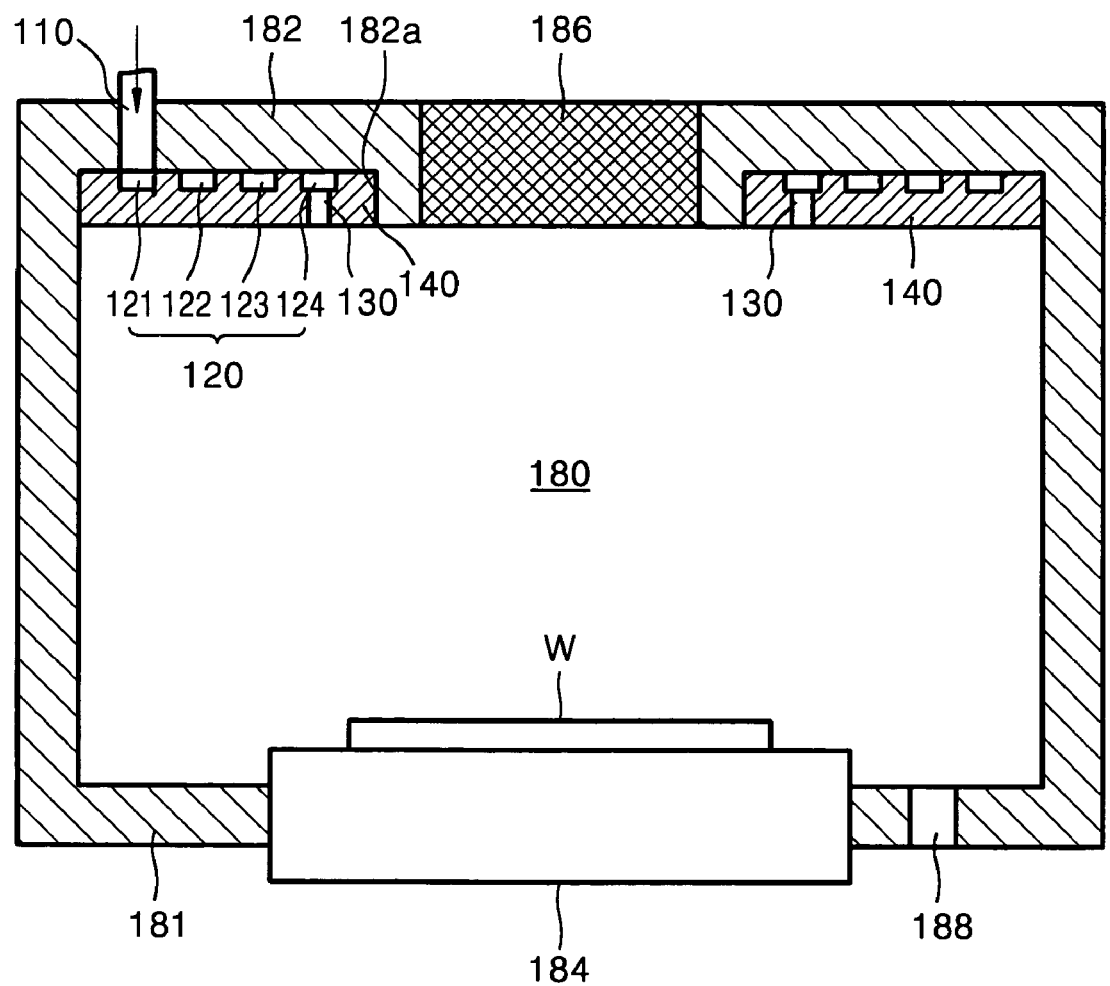
FIGS. 5-9 are cross-sectional diagrams of gas injection apparatuses in plasma processing systems according to first through fifth specific embodiments of the present invention.

FIG. 5 shows a gas injection apparatus according to a first embodiment of the present invention. The first embodiment shown in FIG. 5 is an example in which the gas injection apparatus of FIG. 3A is applied to a plasma processing system without any modifications. The plasma processing system includes a reaction chamber 180 with a space for forming plasma. In order for the interior of the reaction chamber 180 to be kept under vacuum conditions, a vacuum suction hole 188 connected to a vacuum pump (not shown) is formed in a bottom wall 181 of the reaction chamber 180. An electrostatic chuck 184 is disposed at the bottom of the reaction chamber 180 to support a wafer W while a plasma source 186 is disposed at the top of the reaction chamber 180 to ionize the reactive gas injected into the reaction chamber 180 and create plasma. In the case of magnetron sputtering systems, the plasma source 186 may be replaced by a magnetron gun.

The gas injection apparatus according to the first embodiment of this invention includes a gas inlet 110 penetrating an upper wall 182 of the reaction chamber 180 and a flat ring-shaped injector 140 attached to the bottom of the upper wall 182 of the reaction chamber 180. The injector 140 has a manifold 120 including gas channels 121-124, arranged on a plurality of levels and a plurality of nozzles 130. The gas channels 121-124 are sequentially arranged on different levels on the top surface of the injector 140 so that the gas channel 121 is closest to the outer circumference of the injector 140 and the gas channel 124 is closest to the inner circumference of the injector 140. The detailed configuration, operation, and effects of the gas injection apparatus are as described above.

The injector 140 of the gas injecting apparatus according to this invention is inserted into a groove 182a formed in the bottom of the upper wall 182 of the reaction chamber 180. Thus, since there is no projection toward the interior of the reaction chamber 180, ion flux directed from the plasma source 186 toward the wafer W is not prohibited.

Figure 6:
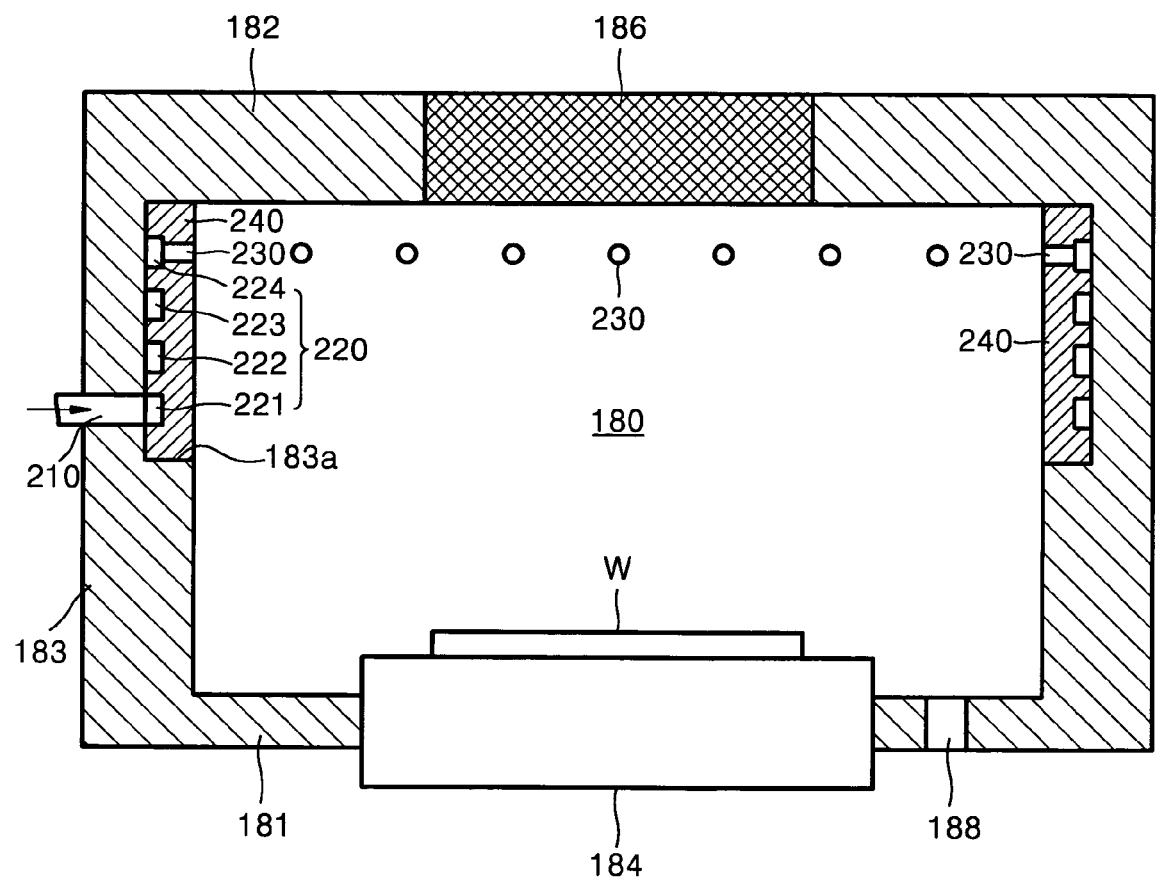

FIG. 6 shows a gas injection apparatus according to a second embodiment of the present invention. The second embodiment shown in FIG. 6 is an example in which the gas injection apparatus of FIG. 3A is modified to have a cylindrical shape and can be applied to a plasma processing system. The gas injection apparatus according to the second embodiment of the present invention includes a gas inlet 210 penetrating a side wall 183 of the reaction chamber 180 and a cylindrical injector 240 attached to the inner surface of the side wall 183 thereof. The injector 240 has a manifold 220 including gas channels 221-224, arranged on a plurality of levels, and a plurality of nozzles 230. The injector 240 may be inserted into a groove 183a formed in the inner surface of the sidewall 183 of the reaction chamber 180.

The gas channels 221-224 may be formed along an outer circumference of the injector 240 in the shape of a groove having a predetermined depth. The gas channels 221 through 224 may be disposed at different levels on the outer circumference of the injector 240 in the direction of the height of the injector 240 so that a high-level gas channel in the gas inlet 210's point of view is located at a place lower in the reaction chamber 180 than a low-level gas channel. A structure in which the gas channels 221-224 are arranged is as described in FIG. 3A.

The nozzles 230 are formed to penetrate the injector 240 from both ends of each of the gas channels 224 at the lowest level toward the interior of the reaction chamber 180. The exits of the plurality of nozzles 230 may be spaced evenly along an inner circumference of the injector 240.

Figure 7:
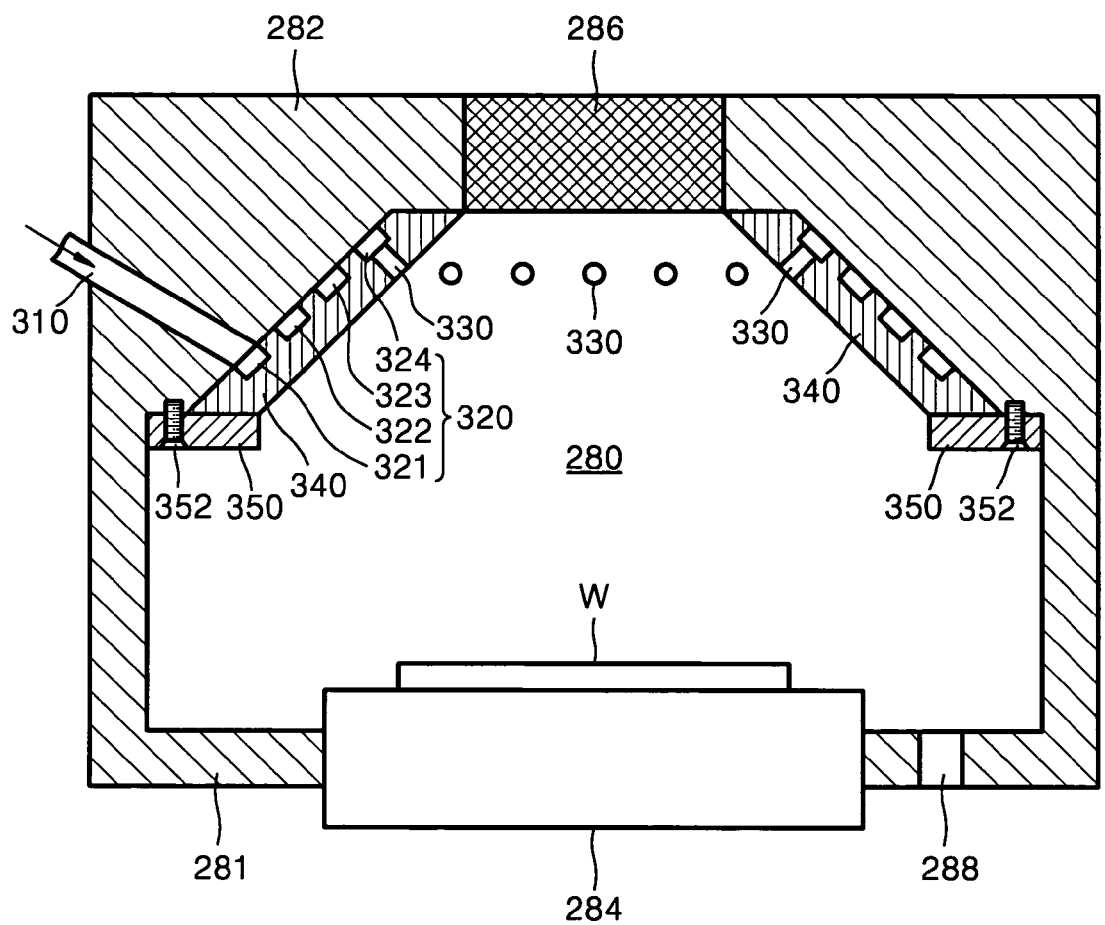

FIG. 7 shows a gas injection apparatus according to a third embodiment of the present invention. The third embodiment shown in FIG. 7 is an example in which the gas injection apparatus of FIG. 3A is modified to have a conical shape and can be applied to a plasma processing system. The gas injection apparatus according to the third embodiment of the present invention includes a gas inlet 310 penetrating an upper wall 282 of a reaction chamber 280 and an injector 340 having a conical shape configured to fit the conically-sloped inner surface of the upper wall 282 of the reaction chamber 280. The injector 340 has a manifold 320 including gas channels 321-324, arranged on a plurality of levels, and a plurality of nozzles 330. The injector 340 is in contact with the sloped inner surface of the upper wall 282 of the reaction chamber 280 and may be supported by a support member 350. The support member 350 may be fixed into the upper wall 282 of the reaction chamber 280 by a screw 352, or other securing arrangement. This configuration also includes an electrostatic chuck 284 for supporting a wafer W, a plasma source 286 and a vacuum suction hole 288.

The gas channels 321-324 may be formed along an outer surface of the injector 340 in the shape of a groove having a predetermined depth. They may be disposed at different levels along the sloped outer surface of the conical injector 340 so that a high-level gas channel in the gas inlet 310's point of view is located at a place lower in the gas reaction chamber 280 than a low-level gas channel. A structure in which the gas channels 321-324 are arranged is as described in FIG. 3A.

The nozzles 330 are formed to penetrate the injector 340 from both ends of each of the gas channels 324 at the lowest level toward the interior of the reaction chamber 280. The exits of the plurality of nozzles 330 may be spaced evenly along an inner circumference of the injector 340.

Figure 8:
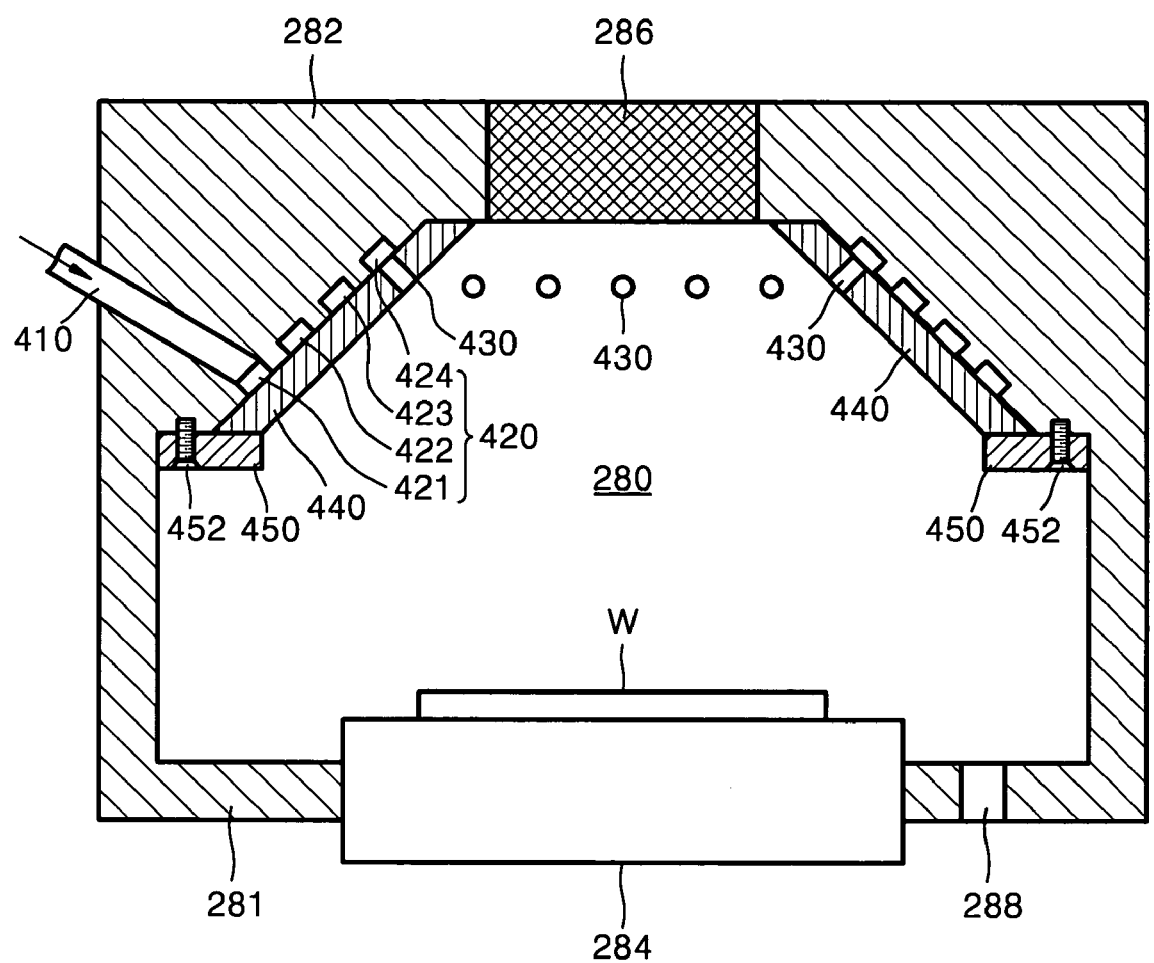

FIG. 8 shows a gas injection apparatus according to a fourth embodiment of the present invention. The gas injection apparatus of FIG. 8 has the same configuration as that of FIG. 7 except for the position where a manifold is formed. The gas injection apparatus according to the fourth embodiment of this invention includes a gas inlet 410 penetrating an upper wall 282 of a reaction chamber 280 and an injector 440 having a conical shape configured to fit the conically sloped inner surface of the upper wall 282 of the reaction chamber 280. A support member 450 fixed to the upper wall 282 of the reaction chamber 280 by a screw 452 or other securing arrangement may support the injector 440.

A plurality of levels of gas channels 421-424 constituting a manifold 420 are formed in the shape of a groove having a predetermined depth on a sloped inner surface of the upper wall 282 of the reaction chamber 280 instead of along an outer surface of the injector 440. Otherwise, the arrangement of the gas channels 421-424 is the same as that of the gas channels 321-324 according to the third embodiment of the present invention.

The injector 440 may be formed of a dielectric liner such as ceramic material resistant to sputtering. The injector 440 is useful where the slightest sputtering has a significant adverse effect on semiconductor processing.

Each of the plurality of nozzles 430 is formed to penetrate the injector 340 from a predetermined location on the outer surface of the injector 440, corresponding to both ends of each of the gas channels 424 at the lowest level toward the interior of the reaction chamber 280. The exits of the plurality of nozzles 430 may be spaced evenly along an inner circumference of the injector 440.

Figure 9:
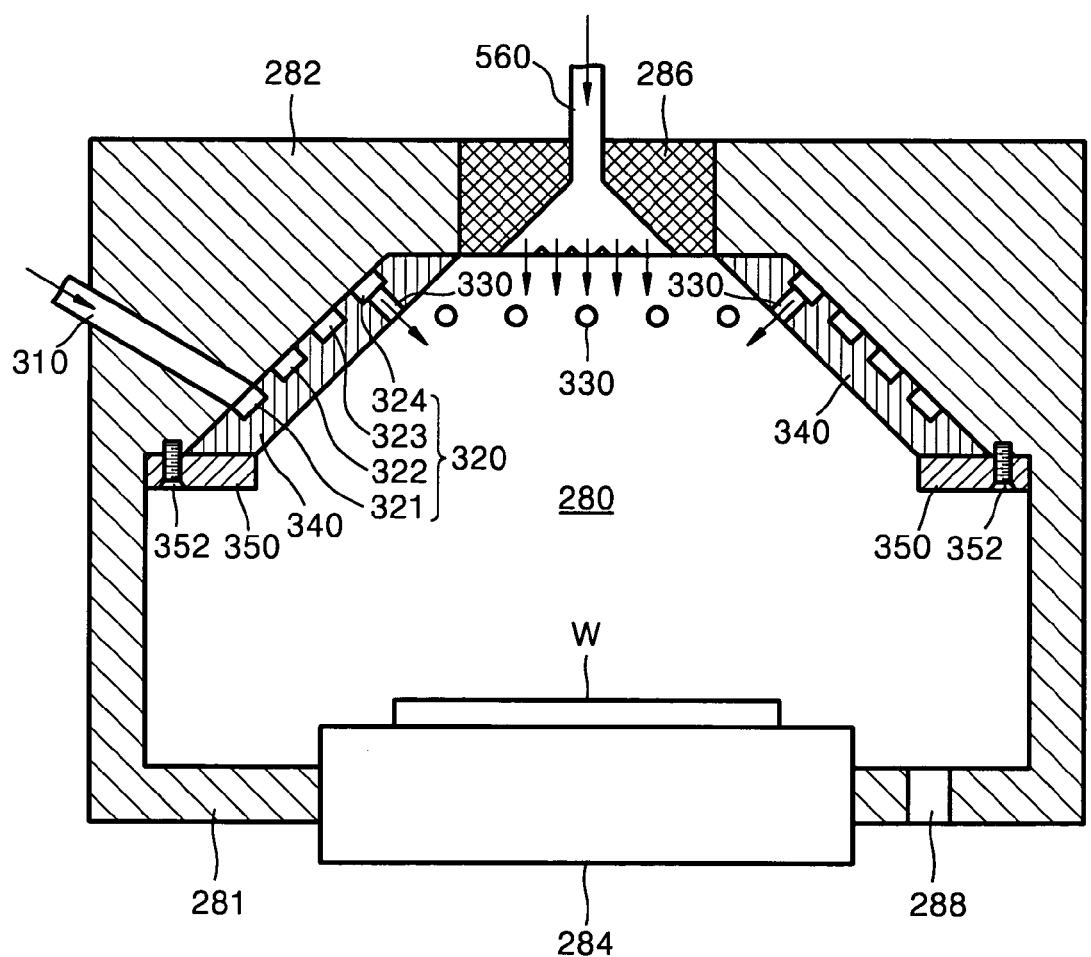

FIG. 9 shows a gas injection apparatus according to a fifth embodiment of the present invention. Referring to FIG. 9, the gas injection apparatus according to the fifth embodiment of this invention includes a gas inlet 310 and a conical injector 340, both having the same configuration as those of FIG. 7. The conical injector 340 has a manifold 320 including gas channels 321-324 arranged on a plurality of levels and a plurality of nozzles 330. Since these and other elements have the same configurations as those of FIG. 7, their detailed descriptions will be omitted here.

The gas injection apparatus according to the fifth embodiment of this invention further includes a showerhead type injector 560 disposed at the top of a reaction chamber 280 through the plasma source 286, for supplying a reactive gas towards the center of the reaction chamber 280. This configuration can improve gas distribution uniformity in a radial direction of the reaction chamber 280. The showerhead type injector 560 may be added to the first through fourth embodiments of this invention as well.

As described above, a gas injection apparatus for a semiconductor processing system according to the invention has at least one of the following features.

First, since the lengths of gas paths connecting a gas inlet to a plurality of nozzles through a manifold are all equal, the pressure and flow rate of gas supplied into a reaction chamber are equal for each of nozzles, thus improving uniformity in semiconductor substrate processing.

Second, the gas injection apparatus according to this invention provides a uniform distribution of reactive gas irrespective of the size of the reaction chamber, gas pressure, and flow rate, thus making it possible to adapt it for a semiconductor processing system with a large reaction chamber.

Third, the gas injection apparatus according to this invention does not prohibit ion flux or microwave propagation, since it is in contact with or fit the inner surface of the wall of the reaction chamber. Thus, there are no projections towards the interior of the reaction chamber, thereby allowing its use in various types of semiconductor processing systems such as plasma enhanced CVD (PECVD), HDP-CVD, and magnetron sputtering systems.

Fourth, this invention provides a uniform pressure distribution among each of the gas paths leading to the plurality of nozzles, in which two or more gas components are mixed evenly, thus making it possible to evenly distribute a mixture of two or more gases over the reaction chamber through a single gas injection apparatus.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, the configuration of gas injection apparatus according to this invention may be modified depending on the type of a semiconductor processing system, shape, and size of a reaction chamber, and the like.

What is claimed is:

1. A gas injection apparatus for injecting a reactive gas into a reaction chamber of a semiconductor processing system, the apparatus comprising:
    an injector disposed to contact an inner surface of a wall of the reaction chamber of the semiconductor processing system, the injector having a plurality of nozzles penetrating it, through which the reactive gas is injected into the reaction chamber;
    a gas inlet penetrating through the wall of the reaction chamber;
    a manifold disposed between the wall of the reaction chamber and the injector, for supplying the reactive gas flowing through the gas inlet to each of the plurality of nozzles; and
    bifurcating gas channels arranged on at least two levels in the manifold, the at least two levels equalizing lengths of gas paths connecting the gas inlet to the plurality of nozzles,
    wherein all surfaces defining the gas channels have a full extent defined by a surface of the injector and a surface of the reaction chamber.

2. The gas injection apparatus as claimed in claim 1, wherein one level of the gas channels of the at least two levels of gas channels is split into two branches at either end of the next higher level of the gas channel, each branch having the same length, the highest level of gas channel is split into two branches, each having the same length at a portion connecting with the gas inlet, and each of the plurality of nozzles is connected to the lowest level of the gas channels.

3. The gas injection apparatus as claimed in claim 2, wherein the gas channels are arranged on four levels.

4. The gas injection apparatus as claimed in claim 2, wherein each of the plurality of nozzles is connected at either end of the lowest level of the gas channels.

5. The gas injection apparatus as claimed in claim 1, wherein a support structure is formed in the inner surface of the wall of the reaction chamber, and the injector is inserted into the support structure.

6. The gas injection apparatus as claimed in claim 1, wherein the gas channels are formed in the shape of a groove on the surface of the injector in contact with the inner surface of the wall of the reaction chamber.

7. The gas injection apparatus as claimed in claim 1, wherein the gas channels are formed in the shape of a groove on the inner surface of the wall of the reaction chamber.

8. The gas injection apparatus as claimed in claim 7, wherein the injector is formed of a dielectric liner.

9. The gas injection apparatus as claimed in claim 8, wherein the dielectric liner is formed of a ceramic material.

10. The gas injection apparatus as claimed in claim 1, wherein exits of the plurality of nozzles are evenly spaced on a surface of the injector opposite to an interior of the reaction chamber, along a circumference of the injector.

11. The gas injection apparatus as claimed in claim 1, wherein the injector is flat and ring-shaped and disposed to contact the bottom of an upper wall of the reaction chamber.

12. The gas injection apparatus as claimed in claim 11, wherein the gas channels are disposed so that a high-level gas channel relative to the gas inlet is closer to an outer circumference of the injector and a low-level gas channel relative to the gas inlet is closer to an inner circumference of the injector.

13. The gas injection apparatus as claimed in claim 1, wherein the injector is cylindrical and disposed to contact an inner surface of a sidewall of the reaction chamber.

14. The gas injection apparatus as claimed in claim 12, wherein the gas channels are disposed on the outer circumference of the injector so that a high-level gas channel relative to the gas inlet is lower in the reaction chamber than a low-level gas channel relative to the gas inlet.

15. The gas injection apparatus as claimed in claim 1, wherein the injector is conical and disposed to contact a sloped inner surface of an upper wall of the reaction chamber.

16. The gas injection apparatus as claimed in claim 15, wherein the gas channels are disposed on the outer circumference of the injector so that a high-level gas channel relative to the gas inlet is located lower in the reaction chamber than a low-level gas channel relative to the gas inlet.

17. The gas injection apparatus as claimed in claim 14, wherein the injector is supported by a support member in the wall of the reaction chamber.

18. The gas injection apparatus as claimed in claim 1, further comprising a sliowerhead injector disposed at the top of the reaction chamber, the showerhead injector supplying the reactive gas towards a center of the reaction chamber.

19. The gas injection apparatus as claimed in claim 1, wherein two or more reactive gases are mixed when passing through the manifold, and a mixture of the two or more reactive gases are injected into the reaction chamber through the plurality of nozzles.

20. The gas injection apparatus as claimed in claim 1, wherein the reaction chamber includes a plasma source or magnetron gun.

* * * * *